United States Patent [19]

Brown

[11] Patent Number: 4,647,866

[45] Date of Patent: Mar. 3, 1987

[54] AUDIO AMPLIFIER OUTPUT STAGE

[75] Inventor: Russell W. Brown, Nepean, Canada

[73] Assignee: Siltronics, Ltd., Ontario, Canada

[21] Appl. No.: 692,198

[22] Filed: Jan. 17, 1985

[30] Foreign Application Priority Data

Jan. 24, 1984 [CA] Canada .................................. 445968

[51] Int. Cl.[4] .............................................. H03F 3/26
[52] U.S. Cl. .................................... 330/262; 330/146;
330/270; 330/271; 330/274; 381/121
[58] Field of Search ............... 330/146, 262, 263, 265,
330/267, 268, 270, 271, 273, 274, 275; 381/120, 121

[56] References Cited

U.S. PATENT DOCUMENTS 4,502,016 2/1985 Siligoni et al. ....................... 330/146

FOREIGN PATENT DOCUMENTS 2431818 1/1976 Fed. Rep. of Germany ...... 330/146
417890 8/1974 U.S.S.R. .............................. 330/146
652687 3/1979 U.S.S.R. .............................. 330/146

*Primary Examiner*—James B. Mullins
*Attorney, Agent, or Firm*—Antonelli, Terry & Wands

[57] ABSTRACT

Apparatus and method for driving a non-centertapped load such as a loudspeaker from a low voltage supply such as a single dry cell, with increased efficiency. A push-pull signal having similar polarity voltage excursions is applied to opposite terminals of the load. Alternate individual terminals of the load which are opposite to the terminals to which the non-idle phases of the push-pull signal are alternately applied are connected to a common terminal via a pair of transistors. The pair of transistors are driven by an amplified representation of the push-pull input signal. Since pulse signals are not used to drive the pair of transistors, capacitors need not be used to eliminate switching transients which would otherwise appear, and increased efficiency results.

12 Claims, 2 Drawing Figures

AUDIO AMPLIFIER OUTPUT STAGE

This invention relates to an amplifier output stage used for amplifiers which operate from very low power supply voltage sources.

Some of the significant design problems of pocket-sized electronic apparatus which utilize an audio output stage, such as a pocket radio, pager, or the like are the size and weight constraints placed on them by a plurality of batteries which will provide sufficient output voltage for efficient operation. The threshold voltage at the input of a typical silicon bipolar output transistor is approximately 0.7 volts. Since the available supply voltage from a single dry cell usually drops to about 1.1 volts toward the end of its useful life, which voltage is less than twice the transistor threshold voltage, circuit configurations for single cell operation are severely constrained. Consequently typically two batteries have been used in series to supply sufficient power.

In order to reduce the number of batteries to one, and still obtain a sufficient voltage swing to drive the loudspeaker without requiring a heavy and bulky output transformer, a center tapped loudspeaker voice coil has been used, with the center tap being connected to the power supply rail. The portions of the loudspeaker voice coil on opposite sides of the center tap are driven in push-pull.

However, it has been found that center tapped speakers are very expensive, and are relatively inefficient.

In order to eliminate the requirement for a center tapped speaker (or equivalent load), yet derive sufficient operating voltage from a single battery dry cell such as "size AA", it was proposed to connect the undriven terminal of a non-center tapped load to the supply rail with the load being driven in push-pull (push-pull drive resulting in one driven and one undriven terminal at each non-idle instant). This provides a peak to peak voltage across the loudspeaker which is greater than the d.c. supply voltage. Switching transistors were used which were driven by pulse signals into their saturated operating modes in order to provide as low a voltage drop connection as possible between the undriven load terminals and the supply rail. Pulse signals were provided to the switching transistor bases, in which the phase of the pulses were derived from the phase of the push-pull signals.

However it has been found that a great deal of current is dissipated in generating the pulse signals which are applied to the switching transistors. In addition, the switching transistors being pulsed on and off have been found to create cross-over distortion due to switching transients and additional filter capacitors are required to reduce the effect of these transients on the output waveform.

The present invention is an amplifier output stage and method for driving a non-center tapped load such as a loudspeaker which substantially reduces the current required to drive the switching transistors. Indeed, the use of pulse signals is specifically avoided; the driving signal varies with the input signal, i.e. the signal applied to the load. Cross-over distortion is also minimized.

The result is a simple circuit having high efficiency, low distortion level and low cost, while avoiding the requirement for a center tapped loudspeaker or other load and the filter capacitors previously used for reducing the transients caused by the driving pulse signals.

In general, the preferred embodiment of the invention is an amplifier output stage comprised of a first pair of transistors for driving a pair of terminals of a load in push-pull with an input signal, a second pair of transistors respectively connected between the terminals and the power supply rail, and circuitry for driving one or the other of the second pair transistors to a saturated conductive state in anti-phase to the signal applied to the terminals, the driving circuitry being comprised of circuitry for providing an amplified form of the input signal to the second pair of transistors as a driving control signal.

Bias circuitry is also utilized for maintaining the second pair of transistors marginally conducting during their idle states whereby load cross-over discontinuous conduction distortion is minimized i.e. they are operated in class AB.

A better understanding of the invention will be obtained by reference to the detailed description below, with reference to the following drawings, in which.

Figure 1:
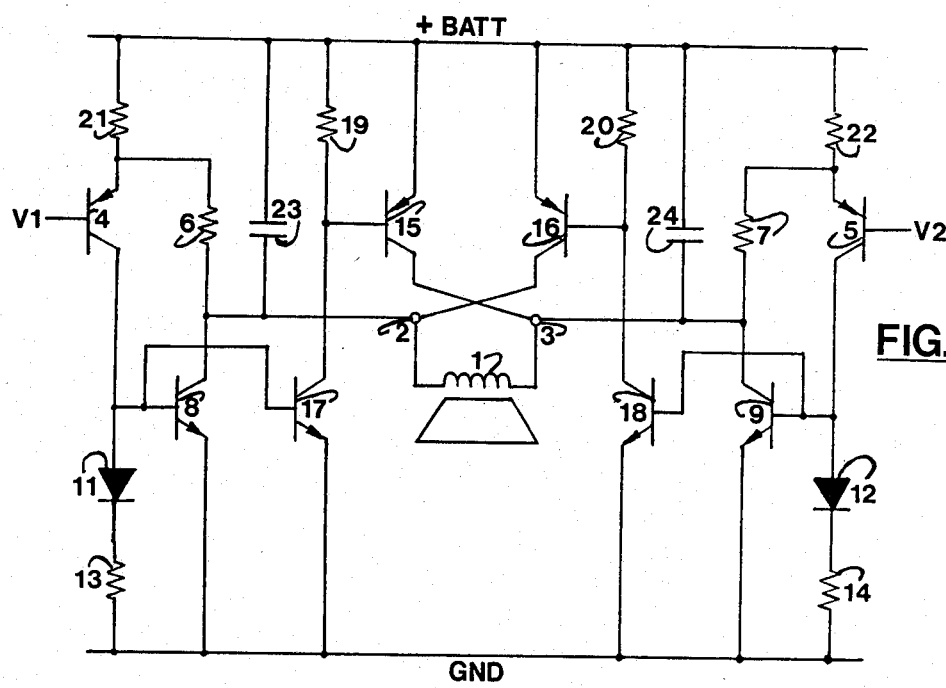
FIG. 1 is schematic diagram of the invention.

Turning to FIG. 1, a loudspeaker or other non-center tapped load 1 is connected between a pair of terminals 2 and 3.

Figure 2:
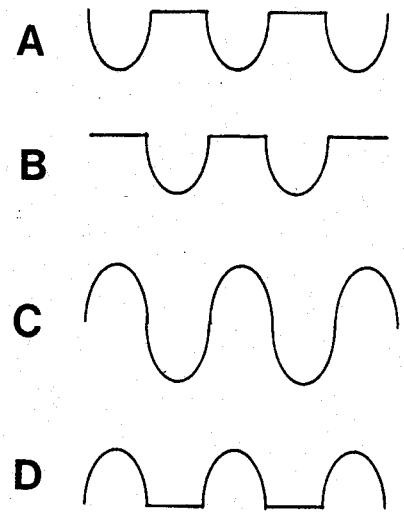
FIG. 2 shows waveforms at various points in the invention.

A pair of input transistors 4 and 5 receive separate polarities (phases) of a push-pull signal at inputs $V_1$ and $V_2$ provided from an input signal phase splitter (not shown since it is not part of the specific present invention) which correspond to example waveforms A and B shown in FIG. 2. The emitters of transistors 4 and 5 are connected via resistors 6 and 7 to the collectors of oppositely poled transistors 8 and 9 respectively. The emitters of transistors 4 and 5 are also connected to an appropriately poled power supply rail through resistors 21 and 22 respectively, the polarity of the rail, for transistors 4 and 5 being of PNP type, being positive and is shown as +BATT. The emitters of transistors 8 and 9 are connected to the oppositely poled supply rail, shown as ground GND. The collectors of transistors 4 and 5 are connected to the bases of transistors 8 and 9 and to ground through diodes 11 and 12 connected in series with resistors 13 and 14 respectively.

When the push-pull input signal is applied at inputs $V_1$ and $V_2$ respectively, the signal is amplified by transistors 4 and 5, is applied to transistors 8 and 9, resulting in an output signal being applied in push-pull to terminals 2 and 3 for passage through load 1.

Resistors 6 and 21 form a feedback circuit which forces terminal 2 (the collector of transistor 8) to receive an amplified replica of the signal at input $V_1$. Resistors 7 and 22 operate similarly, forcing terminal 3 to receive an amplified replica of the signal at input $V_2$.

Transistors 15 and 16 have their collector-emitter circuits connected between terminals 3 and 2 respectively and the power supply rail. With transistors 15 and 16 being of PNP polarity type, their emitters are connected to +BATT. When a signal is applied to input $V_1$ and hence to load terminal 2, transistor 15 is driven into saturation, causing terminal 3 to be connected the supply rail, thus allowing the signal current to pass through transistor 15, load 1 and transistor 8. During this interval transistor 16 is non-conductive.

When a signal is applied to input $V_2$ and hence to load terminal 3, transistor 15 is non-conductive and transistor 16 is driven on, connecting terminal 2 to the supply rail.

The signal thus passes in the opposite direction through load 1.

It should be noted that the push-pull signal applied to load terminals 2 and 3 should both be of similar polarity, but of appropriate phase. For example, both signal waveforms A and B of FIG. 2 are of negative-going polarity, even though they were originally of opposite polarity (one phase could be reversed in polarity in an inverter stage prior to application to this circuit). Since both of the signal phases pass through the load in opposite directions, their amplitudes are additive in the load. Thus the peak to peak voltage achieved across the load can be greater than the battery voltage, and is of the form of waveform C in FIG. 2.

As was noted earlier with reference to the prior art circuit concepts, it would be expected that to switch transistors 15 and 16 correctly their base terminals should have pulse signals applied thereto. However in accordance with the present invention it has been found that pulse signals should not be used during their conductive phases. Driving control signals as will be described later should be applied which are derived from the input signals and are amplified forms of the input signals (not pulse signals), which could be considered as representative of the current applied to the load.

Waveform D in FIG. 2 is a current waveform representation of a representative signal which is applied to the base of transistor 15, or, with phase corresponding to the opposite phase of the push-pull signal, to the base of transistor 16.

Consider for example that the input signal at $V_1$ corresponds to waveform A in FIG. 2. The resulting current conducted in the collector circuit of transistor 17 (waveform D) gradually increases negatively in amplitude, achieving a peak at the time that waveform A achieves an opposite polarity peak, and dropping to remain at a constant level during the interval that the opposite phase current waveform B rises negatively. The base voltage of transistor 15 thus is the inverse polarity of waveform D, and transistor 15 conducts heavily. When waveform D (collector current of transistor 17) is at a constant low level, transistor 15 base voltage is positive, and its collector-emitter circuit does not conduct. In summary during the interval that waveform A input voltage at $V_1$ goes negative, transistor 15 conducts.

Transistor 16 is non-conductive while transistor 15 is conductive since its base is at a constant positive level during those intervals.

However it should be noted that while the signal current represented by waveform D is not of pulse form during the time that it enables transistor 15 to conduct, it should have sufficient amplitude even at a very low signal level (e.g. slightly above the threshold of conduction voltage amplitude) to drive transistor 15 into saturation. Since the transistor 15 and 16 drive current varies with the input signal, rather than being in the form of a pulse, there is significant current which is saved, resulting in a substantial increase in the efficiency of this stage. In addition special pulse forming circuitry need not be provided, since the driving signal merely follows the form of the input signal.

A similar effect occurs when driving the base of transistor 16. A signal of the form of waveform D but in phase with waveform B is applied to the base of transistor 16 which varies with the input signal (waveform B) applied at input terminal $V_2$. When transistor 15 is substantially non-conducting, transistor 16 is conducting heavily (about at its constant saturation level, as described above with reference to transistor 15) by virtue of the varying drive current applied to its base.

In order to achieve the above, in the preferred embodiment transistors 17 and 18 should be of similar polarity types as transistors 8 and 9, e.g. NPN. It is preferred that transistors 17 and 18 should be designed to be similar to transistors 8 and 9, but with emitter areas K times the size of the emitter areas of transistors 8 and 9, in a single integrated circuit. Their bases are connected to the bases of transistors 8 and 9, or are otherwise connected so that they are driven with a base-emitter voltage identical to that of transistors 8 and 9 respectively.

Thus the collector currents of transistors 17 and 18 are K times the collector currents of transistors 8 and 9. The ratio K is selected to ensure that $K \times h_{FE}$ is greater than 1, where $h_{FE}$ is the gain of transistor 15 or 16.

The emitters of transistors 17 and 18 are connected to GND, and their collectors are connected to the bases of transistors 15 and 16 respectively, which themselves are connected to the positive supply rail +BATT through resistors 19 and 20 respectively.

For any value of collector current I8 of transistor 8, the base drive current applied to transistor 15 is $K \times I8$, (neglecting resistor 19), and hence transistor 15 could conduct a collector current I15 which equals $K \times I8 \times h_{FE(transistor\ 15)}$ if it were not saturated. Since we have selected $K \times h_{FE(transistor\ 15)}$ as greater than 1, transistor 15 is always supplied with enough base drive current to support a collector current greater than I8, and hence transistor 15 is maintained in saturation during the partial cycle when transistor 8 is driving. Operation of transistors 9 and 16 is similar.

In summary, as input $V_1$ is driven negatively, transistor 4 supplies increasing drive current to transistors 8 and 17, current conducted by transistor 17 causing transistor 15 to saturate. Simultaneously input $V_2$ is driven to a constant positive level, to transistors 9 and 18 are non-conducting, and hence transistor 16 is non-conductive. As the collector current of transistor 8 increases, the collector current of transistors 8 flows primarily in the load 1, through transistor 15.

A pair of resistors 21 and 22 connect the emitters of transistors 4 and 5 to the positive supply rail. Resistor 6 provides voltage feedback from load terminal 2 to transistor 4 so that during the negative cycle portion of the signal at input $V_1$, the voltage at terminal 2 is forced to be an amplified replica of the signal at input $V_1$. The voltage at terminal 3 is similarly forced to be an amplified replica of the signal at input terminal $V_2$. As noted earlier, since $K \times h_{FE}$ of transistor 15 is greater than 1, the collector current of transistor 17 is sufficient to maintain transistor 15 in saturation, keeping the voltage between terminal 3 and +BATT within the saturation voltage drop value of transistor 15 of the supply rail voltage +BATT.

During the negative half-cycle of $V_2$, a similar function occurs with transistors 5, 9, 18 and 16 as was described earlier with respect to transistors 4, 8, 17 and 15.

Thus an input voltage is amplified and appears across the load 1 with a peak output voltage capability of $+BATT - V_{ce(sat)(QA)} - V_{ce(sat)(QB)}$, in each direction, where QA refers to either transistor 8 or 9 and QB refers to either transistor 15 or 16. Thus a peak voltage approaching the value of the battery voltage is achievable in each polarity direction. It has been found that this circuit achieves this at supply voltages as low as 1 volt d.c. without the use of transformers or a center tapped load.

Capacitors 23 and 24 are connected between the load terminals 2 and 3 and the supply rail. These capacitors provide frequency compensation for the aforenoted feedback loops consisting of transistors 4 and 8 and resistors 6 and 21, and transistors 5 and 9 and resistors 7 and 22 respectively.

The series circuits of diodes 11 and 12 with resistors 13 and 14 reduce the current transfer ratios of the collector currents of transistors 8 and 4. Diode 11 and resistor 13 presents a load on the collector of transistor 4 which reduces the bias current on the base of transistor 8 at idle, since the idle current of the series circuit of diode 11 and resistor 13 is much greater than the base current of transistor 8. During non-idle conditions the current through diode 11 and resistor 13 is nearly constant, so increased transistor 4 collector current goes into the base of transistor 8. Diode 12 and resistor 14 operate similarly with transistors 5 and 9.

The current level in transistors 8 and 17, and 9 and 18 should be set such that transistors 15 and 16 should be conductive at a low level during idle periods (i.e. when the input signals are zero). This will minimize crossover distortion. Indeed, transistors 15 and 16 can idle at their saturation operation levels, but will carry little or no collector current. Once one of the latter transistors begins carrying significant current, the other is driven off.

Typical resistor values for resistors 6 and 7 are about 40 ohms and for resistors 21 and 22 are 10 ohms. Resistors 19 and 20 can be about 20K ohms. With opposite polarity type transistors the polarity of the power supply rails can be reversed.

For a battery supply voltage of 1.3 volts, a sinewave output signal of 0.632 volts RMS (i.e. 50 mw) total harmonic distortion was measured across an 8.2 ohm load of 1.34%.

Since the signal used to drive transistors 15 and 16 are not pulse signals, but are signals which provide base drive for transistors 15 and 16 which are proportional to input signal level, switching transients at the cross-over points are minimized, and the need for extra filter capacitors is eliminated.

Clearly the present circuit provides a substantially improved output circuit, having relatively low distortion, improved efficiency, and can drive a non-center tapped speaker load from a low supply voltage such as may be obtained from a single small dry cell.

A person skilled in the art of understanding this invention may now conceive of variations or other embodiments based on the concepts described herein. All are considered to be within the scope of the invention as defined in the claims appended hereto.

I claim:
1. An amplifier output stage comprising:
   (a) a first similar pair of transistors having inputs for receiving separate phases of a push-pull input signal, having similar polarity voltage excursions,
   (b) a pair of load terminals for connection to a non-center tapped load,
   (c) a first pair of resistor means respectively connected between the emitters of the first transistors and the load terminals,
   (d) a second pair of resistor means respectively connected between the emitters of the first pair of transistors and a first supply rail,
   (e) a second pair of transistors, of similar polarity type as the first pair of transistors, having their emitters connected to the supply rail and their collectors respectively to the load terminals,
   (f) a third pair of resistor means connected between the bases of the second pair of transistors and the supply rail,
   (g) a third pair of transistors of opposite polarity type as the first pair of transistors connected with their bases respectively to the collectors of the first transistors, their collectors to corresponding load terminals, and their emitters to a second supply rail of opposite polarity to the first supply rail,
   (h) a pair of current bias paths connected between the bases of the third pair of transistors and the second supply rail,
   (i) a fourth pair of transistors of polarity type similar to the third pair of transistors, respectively connected with their bases and emitters in parallel to the third pair of transistors, and their collectors connected to the opposite respective bases of the second pair of transistors, the fourth pair of transistors being disposed with the third pair of transistors in an integrated circuit, but having emitter areas a factor K times the emitter areas of the third pair of transistors such that the collector currents of the fourth pair of transistors are constrained to be K times the collector currents of corresponding transistors of the third pair of transistors, the factor K being selected such that the product K times the common emitter current gain of the second pair of transistors is greater than 1, whereby each one of the second pair of transistors is driven into saturation in opposite phase to the push-pull signal applied to the load terminal to which the opposite one of the second pair of transistors is connected.

2. An amplifier output stage as defined in claim 1, further including a pair of capacitor means respectively connected between the load terminals and the first supply rail.

3. An amplifier as defined in claim 2, in which each of the first pair of transistors is PNP type and the first supply rail is positive.

4. An amplifier as defined in claim 2, further including a loudspeaker connected to the load terminals.

5. An amplifier as defined in claim 2, further including a loudspeaker connected to the load terminals, and a nominally 1.5 volt battery connected between the supply rails.

6. An amplifier output stage as defined in claim 1, in which each of said current bias paths is comprised of a diode in series with a resistor, the polarity direction of each diode being similar to that of the base-emitter junctions of the third pair of transistors.

7. An amplifier as defined in claim 6, in which each of the first pair of transistors is PNP type and the first supply rail is positive.

8. An amplifier as defined in claim 6, further including a loudspeaker connected to the load terminals.

9. An amplifier as defined in claim 6, further including a loudspeaker connected to the load terminals, and a nominally 1.5 volt battery connected between the supply rails.

10. An amplifier as defined in claim 1, in which each of the first pair of transistors is PNP type and the first supply rail is positive.

11. An amplifier as defined in claim 1, further including a loudspeaker connected to the load terminals.

12. An amplifier as defined in claim 1, further including a loudspeaker connected to the load terminals, and a nominally 1.5 volt battery connected between the supply rails.

* * * * *